US006503686B1

(12) United States Patent
Fryd et al.

(10) Patent No.: US 6,503,686 B1
(45) Date of Patent: Jan. 7, 2003

(54) NITRILE/FLUOROALCOHOL-CONTAINING PHOTORESISTS AND ASSOCIATED PROCESSES FOR MICROLITHOGRAPHY

(75) Inventors: Michael Fryd, Moorestown, NJ (US); Frank L Schadt, III, Wilmington, DE (US); Mookkan Periyasamy, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/714,782

(22) Filed: Nov. 16, 2000

Related U.S. Application Data
(60) Provisional application No. 60/166,035, filed on Nov. 17, 1999.

(51) Int. Cl.$^7$ ................................................ G03F 7/039
(52) U.S. Cl. ..................... 430/270.1; 430/905; 430/907
(58) Field of Search .............................. 430/270.1, 905, 430/907

(56) References Cited

U.S. PATENT DOCUMENTS

| | | | |
|---|---|---|---|
| 3,414,549 A | 12/1968 | Schaefgen | |
| 3,444,148 A | 5/1969 | Adelman | |
| 4,421,843 A | * 12/1983 | Hattori et al. | ............... 427/490 |
| 5,177,166 A | 1/1993 | Kobo et al. | |
| 5,229,473 A | 7/1993 | Kobo et al. | |
| 6,242,153 B1 | * 6/2001 | Sato et al. | ............... 430/270.1 |

FOREIGN PATENT DOCUMENTS

| | | |
|---|---|---|
| DE | 4207261 A1 | 9/1993 |
| DE | 4207261 | 9/1993 |
| DE | 4207264 | 9/1993 |
| DE | 4319178 A1 | 12/1993 |
| EP | 0789278 A2 | 8/1997 |
| JP | 123263 | 12/1986 |
| JP | 62240953 | 10/1987 |
| JP | 6-161109 | 6/1994 |
| JP | 8-174107 | 6/1996 |
| SU | 2487894/28-12 | 2/1979 |

OTHER PUBLICATIONS

Synthesis and Evaluation of Alicyclic Backbone Polymers for 193 nm Lithography, Ito et al., American Chemical Society, (1998), Chapter 16, pp. 208–222.
Advances in Resist Technology and Processing IX, Anthony E. Novembre, The International Society for Optical Engineering Mar. 1992, vol. 1672, pp. 500–512.
Synthesis and Preliminary Evaluation of Substituted Poly(Norbornene Sulfones) for 193 NM Lithography, Ito et al., 1997 American Chemical Society, vol. 77, p. 449–450.
Dry Etch Resistance of Organic Materials, Gokan et al., J. Electrochem, Soc., Jan. 1983, pp. 143–146.
Cyclization Reaction in Acrylonitrile–Contained Acrylic Copolymers and Its Possible Application for the Improvement of Dry Etch Resistance for Photoresists, Zhao et al., J. Photopolym. Sci. Technol., vol. 11, No. 3, 1998, pp. 525–532.
Organic Materials Challenges for 193 nm Imaging, Acc. Chem. Res. 1999, 32, p. 659–667, Reichmanis et al.
Synthesis of Cycloolefin–Maleic Anhydride Alternating Copolymers for 193 nm Imaging, Houlihan et al., Macromolecules, vol. 30, No. 21, 1997.
Poly(alpha–methyl–p–hydroxystyrene–co–methacrylonitrile) Based Single–Layer Resists for VUV Lithography: (1) Synthesis, Properties and Photochemistry, Shirai et al., J. of Photopolymer Science and Technology, vol. 13, No. 3 (2000), pp. 459–466.
Photochemical Reaction of Polymers Used as Resists by 146–nm Light Exposure, Kishimura et al., J. of Photopolymer Science and Technology, vol. 12, No. 5 (1999), pp. 717–720.

* cited by examiner

Primary Examiner—John S. Chu

(57) ABSTRACT

Nitrile/fluoroalcohol-containing photoresists and associated processes for microlithography are described. These photoresists are comprised of a fluoroalcohol functional group and a nitrile-containing compound which together simultaneously impart high ultraviolet (UV) transparency and developability in basic media to these materials. The materials of this invention have high UV transparency, particularly at short wavelengths, e.g., 157 nm, which makes them highly useful for lithography at these short wavelengths.

49 Claims, No Drawings

NITRILE/FLUOROALCOHOL-CONTAINING PHOTORESISTS AND ASSOCIATED PROCESSES FOR MICROLITHOGRAPHY

This application claims the benefit of Ser. No. 60/166,035, filed Nov. 17, 1999.

BACKGROUND OF THE INVENTION

1. Field of the Invention

The present invention pertains to photoimaging and, in particular, the use of photoresists (positive-working and/or negative-working) for imaging in the production of semiconductor devices. The present invention also pertains to photoresists containing polymer compositions having high UV transparency (particularly at short wavelengths, e.g., 157 nm or 193 nm) which are useful as base resins in resists and potentially in many other applications.

2. Background

Polymer products are used as components of imaging and photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, ultraviolet (UV) light or other electromagnetic radiation impinges on a material containing a photoactive component to induce a physical or chemical change in that material. A latent image is thereby produced which can be processed into a useful image for semiconductor device fabrication.

Although the polymer product itself may be photoactive, generally a photosensitive composition contains one or more photoactive components in addition to the polymer product. Upon exposure to electromagnetic radiation (e.g., UV light), the photoactive component acts to change the rheological state, solubility, surface characteristics, refractive index, color, electromagnetic characteristics and/or other such physical or chemical characteristics of the photosensitive composition as described in the Thompson et al. publication supra.

For imaging very fine features at the submicron level in semiconductor devices, electromagnetic radiation in the far or extreme ultraviolet (UV) is needed. Positive working photoresists generally are utilized for semiconductor manufacture. Lithography in the UV at 365 nm (I-line) using novolak polymers and diazonaphthoquinones as dissolution inhibitors is a currently established chip technology having a resolution limit of about 0.35–0.30 micron. Lithography in the far UV at 248 nm using p-hydroxystyrene polymers is known and has a resolution limit of 0.35–0.18 nm. There is strong impetus for future photolithography at even shorter wavelengths, due to a decreasing lower resolution limit with decreasing wavelength (i.e., a resolution limit of 0.18–0.12 micron for 193 nm imaging and a resolution limit of about 0.07 microns for 157 nm imaging). Photolithography using 193 nm exposure wavelength (obtained from an argon fluorine (ArF) excimer laser) is a leading candidate for future microelectronics fabrication using 0.18 and 0.13 µm design rules. Photolithography using 157 nm exposure wavelength (obtained from a fluorine excimer laser) is a leading candidate for future microlithography further out on the time horizon (beyond 193 nm). There is a strong need for photoresist materials having sufficient transparency and other required properties at these very short wavelengths. The opacity of traditional near UV and far UV organic photoresists at 193 nm or shorter wavelengths precludes their use in single-layer schemes at these short wavelengths.

Photoresist compositions, also referred to herein as "resists", suitable for imaging at 157 nm are presently unknown. The main reason for this current status of 157 nm resists is that all conventional resist materials absorb to a significant degree at this wavelength to preclude their use as component(s) in 157 nm resists.

There is a critical need for suitable novel resist compositions for use at 193 nm, and particularly at 157 nm, or lower wavelengths, that have not only high transparency at these short wavelengths but also suitable other key properties, including good plasma etch resistance, development characteristics, and adhesive properties.

SUMMARY OF THE INVENTION

In some embodiments, the invention is a photoresist comprising:
(a) a polymer comprising:
   (i) a repeat unit derived from at least one ethylenically unsaturated compound containing a fluoroalcohol functional group having the structure:

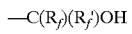
   —C($R_f$)($R_f'$)OH wherein $R_f$ and $R_f'$ are the same or different fluoroalkyl groups of from 1 to about 10 carbon atoms or taken together are $(CF_2)_n$ wherein n is 2 to about 10; and
   (ii) a repeat unit derived from at least one ethylenically unsaturated compound having the structure:

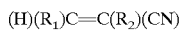
   (H)($R_1$)C=C($R_2$)(CN)

wherein $R_1$ is a hydrogen atom or CN group; $R_2$ is $C_1$–$C_8$ alkyl group, hydrogen atom, or $CO_2R_3$ group, where $R_3$ is $C_1$–$C_8$ alkyl group or hydrogen atom; and
(b) at least one photoactive component.

In other embodiments, the invention is a process for preparing a photoresist image on a substrate comprising, in order:
(A) applying a photoresist composition on a substrate to form a photoresist layer, wherein the photoresist composition comprises:
   (i) a polymer comprising:
      (a) a repeat unit derived from at least one ethylenically unsaturated compound containing a fluoroalcohol functional group having the structure:

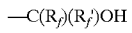
      —C($R_f$)($R_f'$)OH wherein $R_f$ and $R_f'$ are the same or different fluoroalkyl groups of from 1 to about 10 carbon atoms or taken together are $(CF_2)_n$ wherein n is an integer ranging from 2 to about 10; and
      (b) a repeat unit derived from at least one ethylenically unsaturated compound having the structure:

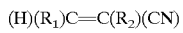
      (H)($R_1$)C=C($R_2$)(CN)

wherein $R_1$ is hydrogen atom or CN group; $R_2$ is an alkyl group of 1 to about 8 carbon atoms, hydrogen atom, or $CO_2R_3$ group, wherein $R_3$ is an alkyl group of 1 to about 8 carbon atoms or hydrogen atom; and;
   (ii) at least one photoactive component;
(B) imagewise exposing the photoresist layer to form imaged and non-imaged areas; and
(C) developing the exposed photoresist layer having imaged and non-imaged areas to form the photoresist image on the substrate.

Typically the photoresist composition is further comprised of a solvent, and the process (as given supra) further comprises, between steps (A) and (B), a step of drying the photoresist composition to substantially remove solvent and thereby form a photoresist layer on the substrate.

With respect to some specific embodiments of the photoresists and associated processes of this invention, the polymer (nitrile/fluoroalcohol-containing polymer) present as a component in the photoresists preferably has an absorption coefficient of less than $5.0\,\mu m^{-1}$ at a wavelength of 157 nm. In other certain embodiments, the (nitrile/fluoroalcohol-containing) polymer is further comprised of protected acid groups and/or aliphatic polycyclic functionality. In some embodiment(s), the photoactive component of the photoresists and associated processes is a photoacid generator. In still other certain embodiment(s), the photoresists and associated processes are further comprised of a dissolution inhibitor.

DETAILED DESCRIPTION OF THE INVENTION

A key characteristic of the polymers (and photoresists comprised of the polymers) of this invention is the cooperative combination in the polymers of repeat unit(s) containing a fluoroalcohol functional group with repeat units containing the cyano (CN) group. Another characteristic of the polymer is that it lacks amounts of functionality sufficient to cause the polymer to detrimentally absorb in the extreme and far UV. The presence of repeat units containing fluoroalcohol functional groups is desirable in order for the polymers to be sufficiently acidic to be developable in basic aqueous media while at the same time minimizing the need for having alternate functionality, such as carboxylic acid, present for developability, which may lead to too high absorptions in the deep UV for these materials to be used in resists at these low imaging wavelengths (e.g., 157 nm or 193 nm). The presence of repeat units containing cyano (CN) functionality in these polymers is desirable in order for the polymers to possess high optical transparency, i.e., to have low optical absorptions in the extreme and far UV, and improved etch resistance, while at the same time providing polar functionality that significantly imparts increased developability to these polymers and affords suitable development characteristics with lower levels of fluoroalcohol functional groups than would otherwise, usually, be required. The minimization of functionality, such as aromatic groups, which absorb in the extreme ultraviolet in the repeat units of the polymers is desirable in order for these polymers to possess high optical transparency.

Nitrile/Fluoroalcohol-Containing Polymers

A given nitrile/fluoroalcohol-containing polymer comprising a repeat unit derived from at least one ethylenically unsaturated compound containing a fluoroalcohol functional group according to this invention has fluoroalkyl groups present as part of the fluoroalcohol functional group.

These fluoroalkyl groups are designated as $R_f$ and $R_f'$, which can be partially fluorinated alkyl groups or fully fluorinated alkyl groups (i.e., perfluoroalkyl groups). The groups designated by $R_f$ and $R_f'$ are the same or different fluoroalkyl groups of from 1 to about 10 carbon atoms or, taken together, are $(CF_2)_n$ wherein n is 2 to about 10. The terms "taken together" mean that $R_f$ and $R_f'$ are not separate, discrete fluorinated alkyl groups, instead together they form a ring structure such as is illustrated below in the case of a 5-membered ring:

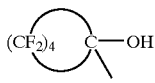

$R_f$ and $R_f'$ can be partially fluorinated alkyl groups without limit according to the invention except that there must be a sufficient degree of fluorination present to impart acidity to the hydroxyl (—OH) of the fluoroalcohol functional group, such that the hydroxyl proton is substantially removed in basic media, such as in aqueous sodium hydroxide solution or tetraalkylammonium hydroxide solution. According to the invention, there will usually be sufficient fluorine substitution present in the fluorinated alkyl groups of the fluoroalcohol functional group such that the hydroxyl group will have a $pK_a$ value of less than or equal to about 11. In preferred cases according to the invention, there will be sufficient fluorine substitution present in the fluorinated alkyl groups of the fluoroalcohol functional group such that the hydroxyl group will have a $pK_a$ value between about 4 and about 11. More preferably, $R_f$ and $R_f'$ are independently perfluoroalkyl group of 1 to 5 carbon atoms, and, most preferably, $R_f$ and $R_f'$ are both trifluoromethyl ($CF_3$) groups.

Some illustrative, but nonlimiting, examples of monomers falling within the generalized structural formula (given supra) containing a fluoroalcohol functional group and within the scope of the invention are presented below:

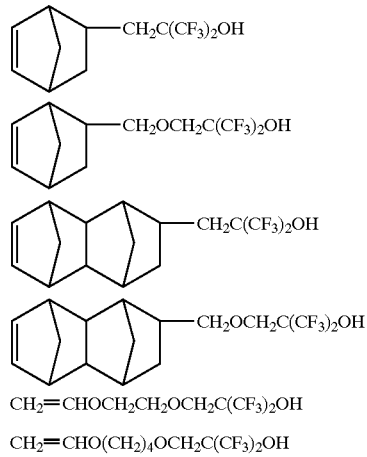

For a particular embodiment of the invention, the fluoroalcohol functional group has the structure:

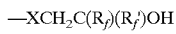

wherein $R_f$ and $R_f'$ are the same or different fluoroalkyl groups of from 1 to about 10 carbon atoms or taken together are $(CF_2)_n$ wherein n is 2 to about 10; X is selected from the group consisting of oxygen atom, sulfur atom, nitrogen atom, phosphorous atom, other Group VB element, and other Group VIB element (Sargent Welch Periodic Table, 1979, Sargent Welch Scientific Company, Skokie, Ill.). The terms "other Group VA element" and "other Group VIA element" are understood to mean any other element in one of these groups of the periodic table that is other than the recited elements (i.e., oxygen, sulfur, nitrogen, phosphorous) in these groups. Oxygen is the preferred group.

At least a portion of the nitrile functionality that is present in the nitrile/fluoroalcohol polymers of this invention results from incorporation of repeat unit(s) derived from at least one ethylenically unsaturated compound having at least one nitrile group and having the structure:

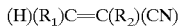

wherein $R_1$ is H or CN; $R_2$ is $C_1$–$C_8$ alkyl, H, or $CO_2R_3$ where $R_3$ is $C_1$–$C_8$ alkyl group or H. CN represents a cyano (nitrile) group. Acrylonitrile, methacrylonitrile, fumaronitrile (trans-1,2-dicyanoethylene), and maleonitrile (cis-1,2-dicyanoethylene) are preferred. Acrylonitrile is most preferred.

The nitrile/fluoroalcohol polymers preferably are characterized in having a repeat unit derived from at least one ethylenically unsaturated compound containing the fluoroalcohol functional group that is present in the nitrile/fluoroalcohol polymers from about 10 to about 60 mole percent and a repeat unit derived from the at least one ethylenically unsaturated compound containing at least one nitrile group present in the polymer from about 20 to about 80 mole percent. The nitrile/fluoroalcohol polymers more preferably with respect to achieving low absorption coefficient values are characterized in having a repeat unit derived from at least one ethylenically unsaturated compound containing the fluoroalcohol functional group that is present in the polymers at less than or equal to 45 mole percent, and, still more preferably, at less than or equal to 30 mole percent with relatively small amounts of a repeat unit containing the nitrile group making at least a portion of the balance of the polymer.

It is recognized though that there usually will be a minimal level of fluoroalcohol functional groups present for the polymer to be soluble and/or dispersible in aqueous basic solutions (e.g., standard 0.262 N TMAH solution) that is required for developability. This minimal level can vary with the structure of the moiety bearing the fluoroalcohol functional group and with the selection of comonomer(s) and their levels that are present in the polymers as well as with other parameters of the polymer such as molecular weight. Some specific illustrative examples of polymers having fluoroalcohol which were found to have too low solubility in aqueous basic media are AN/IBFA (76/24) and AN/IBFA/NB (61/21/18). One skilled in the art can determine readily whether a given polymer is soluble/dispersible or not in aqueous basic solutions. This requirement for having a suitable minimal level of fluoroalcohol functional group in the polymer to impart base solubility/dispersibility to the polymer is usually balanced against keeping the level as low as feasible in order to maximize transparency of the polymer in the far/extreme UV range of the electromagnetic spectrum.

In one embodiment of the invention, the photoresist includes at least one protected functional group. The functional group of the at least one protected functional group is, typically, selected from the group consisting of acidic functional groups and basic functional groups. Nonlimiting examples of functional groups of the protected functional group are carboxylic acids and fluoroalcohols. At least one fluoroalcohol group of the polymer or other functional group of the polymer (such as a carboxylic acid group) may be protected. In an alternative embodiment, an additive composition containing protected functional groups may be incorporated into the photoresist composition. If such an additive is included, none, some or all of the functional groups of the polymer may be protected. Thus, the photoresist composition may comprise at least one member selected from the group consisting of a carboxylic acid, a fluoroalcohol (from the the nitrile/fluoroalcohol polymer but it can additionally be from an additive), a protected fluoroalcohol, and a protected carboxylic acid.

A given nitrile/fluoroalcohol polymer of this invention can be further comprised of protected acidic groups. In these embodiment(s), the percentage of repeat units of the nitrile/fluoroalcohol polymer containing protected acidic groups broadly ranges from about 1 to about 70 mole percent; preferably ranges from 5 to 55 mole percent; and more preferably ranges from 10 to 45 mole percent.

In another embodiment, a nitrile/fluoroalcohol polymer of this invention can include aliphatic polycyclic functionality. In this embodiment, the percentage of repeat units of the nitrile/fluoroalcohol polymer containing aliphatic polycyclic functionality ranges from about 1 to about 70 mole percent; preferably from about 10 to about 55 mole percent; and more preferably ranges from about 20 to about 45 mole percent.

The nitrile/fluoroalcohol polymers of this invention can contain additional functional groups beyond those specifically mentioned herein with the proviso that, preferably, aromatic functionality is absent in the nitrile/fluoroalcohol polymers. The presence of aromatic functionality in these polymers has been found to detract from their transparency and result in their being too strongly absorbing in the deep and extreme UV regions to be suitable for use in photoresists that are imaged at these wavelengths.

In many embodiments according to this invention, a given nitrile/fluoroalcohol polymer preferably has an absorption coefficient of less than 5.0 $\mu m^{-1}$ at a wavelength of 157 nm, more preferably less than 4.0 $\mu m^{-1}$ at this wavelength, still more preferably less than 3.5 $\mu m^{-1}$ at this wavelength, and most preferably less than 3.00 $\mu m^{-1}$ at this wavelength.

The polymers of this invention can be synthesized by the solution polymerization procedure reported in the examples. Any of the commonly used organic solvents known to those skilled in the art can be used as the solvent for polymerization. The solvent used for the polymerization depends upon the composition of the polymers. The temperature for the polymerization can be at the reflux temperature of the polymerization reaction mixture or lower if the polymerization is carried out at atmospheric pressure and reflux conditions. If the polymerization is carried out under pressure, the polymerization temperature can be in the range of about 20 to about 150° C. Alternatively the above polymers can be synthesized by (a) emulsion or (b) suspension (bead) polymerization procedures.

Branched Polymer

In some embodiments of this invention, the polymer is a branched polymer comprising one or more branch segment (s) chemically linked along a linear backbone segment. The branched polymer can be formed during free radical addition polymerization of at least one ethylenically unsaturated macromer component and at least one ethylenically unsaturated comonomer. The ethylenically unsaturated macromer component has a number average molecular weight ($M_n$) between a few hundred and about 40,000 and the linear backbone segment resulting from the polymerization has a number average molecular weight ($M_n$) between about 2,000 and about 500,000. The weight ratio of the linear backbone segment to the branch segment(s) is within a range of about 50/1 to about 1/10, and preferably within the range of about 80/20 to about 60/40. Preferably the macromer component has a number average molecular weight ($M_n$) from about 500 to about 40,000 and more preferably of about 1,000 to about 15,000. Typically such an ethylenically unsaturated macromer component can have a number average molecular weight ($M_n$) equivalent to there being from about 2 to about 500 monomer units used to form the macromer component, preferably between about 30 and about 200 monomer units, and most preferably about 10 to about 50 monomer units.

In a preferred embodiment, the branched polymer contains from about 25% to about 100% by weight of compatibilizing groups, i.e., functional groups present to increase compatibility with the photoacid generator, preferably from about 50% to about 100% by weight, and more preferably from about 75% to about 100% by weight. Suitable compatibilizing groups for ionic photoacid generators include, but are not limited to, both non-hydrophilic polar groups and hydrophilic polar groups. Suitable non-hydrophilic polar groups include, but are not limited to, cyano (—CN) and nitro (—$NO_2$). Suitable hydrophilic polar groups include, but are not limited to protic groups such as hydroxy (OH), amino ($NH_2$), ammonium, amido, imido, urethane, ureido, or mercapto; or carboxylic ($CO_2H$), sulfonic, sulfinic, phosphoric, or phosphoric acids or salts thereof. Preferably, compatibilizing groups are present in the branch segment(s).

Preferably, the protected acidic groups, present in the branched polymer, produce fluoroalcohol groups and/or carboxylic acid groups after exposure to WV or other actinic radiation and subsequent post-exposure baking (i.e., during deprotection). The branched polymer when present in the photosensitive compositions of this invention, typically will contain between about 3% to about 40% by weight of monomer units containing protected acidic groups, preferably between about 5% to about 50%, and more preferably between about 5% to about 20%. The branch segments of such a preferred branched polymer typically contain between 35% to 100% of the protected acidic groups present. Such a branched polymer when completely unprotected (all protected acidic groups converted to free acidic groups) has an acid number between about 20 and about 500, preferably between about 30 and about 330, and more preferably between about 30 and about 130, and analogously the ethylenically unsaturated macromer component preferably has an acid number of about 20 and about 650, more preferably between about 90 and about 300 and the majority of the free acidic groups are in the branch segments.

In a specific embodiment, the branched polymer comprises one or more branch segments chemically linked along a linear backbone segment wherein the branched polymers have a number average molecular weight ($M_n$) of about 500 to about 40,000. The branched polymer contains at least about 0.5% by weight of branch segments. The branch segments, also known as polymer arms, typically are randomly distributed along the linear backbone segment. The "polymer arm" or branch segment is a polymer or oligomer of at least two repeating monomer units, which is attached to the linear backbone segment by a covalent bond. The branch segment, or polymer arm, can be incorporated into the branched polymer as a macromer component, during the addition polymerization process of a macromer and a comonomer. A "macromer" for the purpose of this invention, is a polymer, copolymer or oligomer of molecular weight ranging from several hundred to about 40,000 containing a terminal ethylenically unsaturated polymerizable group. Preferably the macromer is a linear polymer or copolymer end capped with an ethylenic group. Typically, the branched polymer is a copolymer bearing one or more polymer arms, and preferably at least two polymer arms, and is characterized in that between about 0.5 and about 80 weight %, preferably between about 5 and about 50 weight % of the monomeric components used in the polymerization process is a macromer. Typically, comonomer components used along with the macromer in the polymerization process likewise contain a single ethylenic group that can polymerize with the ethylenically unsaturated macromer.

The ethylenically unsaturated macromer and the resulting branch segment of the branched polymer, and/or the backbone of the branched polymer, can have bonded thereto one or more protected acidic groups. For the purposes of this invention, a "protected acidic group" means a functional group which, when deprotected, affords free acidic functionality that enhances the solubility, swellability, or dispersibility in aqueous environments, of the macromer and/or the branched polymer to which it is bonded. The protected acidic group may be incorporated into the ethylenically unsaturated macromer and the resulting branch segment of the branched polymer, and/or the backbone of the branched polymer, either during or after their formation.

While addition polymerization using a macromer and at least one ethylenically unsaturated monomer is preferred for forming the branched polymer, all known methods of preparing branched polymers using either addition or condensation reactions can be utilized in this invention. Furthermore, use of either preformed backbones and branch segments or in situ polymerized segments are also applicable to this invention.

The branch segments attached to the linear backbone segment can be derived from terminally ethylenically unsaturated macromers prepared by methods well known in the art, such as provided in the general descriptions in U.S. Pat. No. 4,680,352 and U.S. Pat. No. 4,694,054.

The branched polymer may be prepared by any conventional addition polymerization process. The branched polymer, or comb polymer, may be prepared from one or more compatible ethylenically unsaturated macromer components and one or more compatible, conventional ethylenically unsaturated macromer components and one or more compatible, conventional ethylenically unsaturated monomer component(s). Preferred addition polymerizable, ethylenically unsaturated monomer components are acrylonitrile, methacrylonitrile, fumaronitrile, maleonitrile, protected and/ or unprotected unsaturated fluoroalcohols, and protected and/or unprotected unsaturated carboxylic acids.

Photoactive Component (PAC)

The compositions of this invention contain at least one photoactive component (PAC) that usually is a compound that affords either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure I), 2) iodonium salts (structure II), and 3) hydroxamic acid esters, such as structure III.

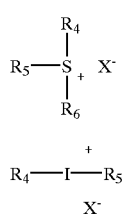

-continued

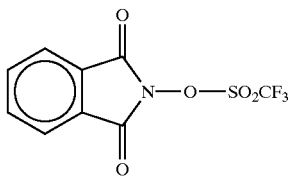

III

In structures I–II, $R_4$–$R_6$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to, hydroxyl (—OH) and $C_1$–$C_{20}$ alkyloxy (e.g., $ClOH_{21}O$). The anion X— in structures I—II can be, but is not limited to, $SbF_6$-(hexafluoroantimonate), $CF_3SO_3$-(trifluoromethylsulfonate=triflate), and $C_4F_9SO_3$- (perfluorobutylsulfonate).

Protective Groups for Removal by PAC Catalysis

The nitrile/fluoroalcohol-containing polymers of the resist compositions of this invention may contain one or more components having protected acidic fluorinated alcohol groups and/or other acidic or basic groups that can yield, by catalysis of acids or bases generated photolytically from photoactive compounds (PACs), hydrophilic acidic or basic groups which enable development of resist coatings. A given protected acidic or basic group is one that is normally chosen on the basis of its being acid or base labile, such that when photoacid or photobase is produced upon imagewise exposure, the acid or base will catalyze deprotection and production of hydrophilic acidic or basic groups that are necessary for development under aqueous conditions. In addition, the nitrile/fluoroalcohol-containing polymers may also contain acidic or basic functionality that is not protected. The nitrile/fluoroalcohol-containing polymers may contain at least one, more than one, or all fluoroalcohol groups that is/are protected. Photoresists comprised of the nitrile/fluoroalcohol-containing polymers of this invention can be heated to promote deprotection necessary for image formation. A functional group when deprotected affords free acidic functionality that enhances the solubility, swellability, and/or dispersibility in aqueous environments of the polymer to which the functional group is bonded.

Nonlimiting examples of components having protected acidic groups that yield an acidic group as the hydrophilic group upon exposure to photogenerated acid include a) esters capable of forming, or rearranging to, a tertiary cation, b) esters of lactone, c) acetal esters, d) β-cyclic ketone esters, e) α-cyclic ether esters, f) MEEMA (methoxy ethoxy ethyl methacrylate) and other esters which are easily hydrolyzable because of anchimeric assistance, g) carbonates formed from a fluorinated alcohol and a tertiary aliphatic alcohol. Some specific examples in category a) are t-butyl ester, 2-methyl-2-adamantyl ester, and isobornyl ester. Some specific examples in category b) are γ-butyrolactone-3-yl, γ-butyrolactone-2-yl, mavalonic lactone, 3-methyl-γ-butyrolactone-3-yl, 3-tetrahydrofuranyl, and 3-oxocyclohexyl. Some specific examples in category c) are 2-tetrahydropyranyl, 2-tetrahydrofuranyl, and 2,3-propylenecarbonate-1-yl.

Additional examples in category c) include various esters from addition of vinyl ethers, such as, for example, ethoxy ethyl vinyl ether, methoxy ethoxy ethyl vinyl ether, and acetoxy ethoxy ethyl vinyl ether.

Examples of components having protected acidic groups that yield a fluorinated alcohol as the hydrophilic group upon exposure to photogenerated acid or base include, but are not limited to, t-butoxycarbonyl (t-BOC), t-butyl ether, and 3-cyclohexenyl ether. Each of these protected acidic groups can be utilized in combination with the fluoroalcohol functional group of this invention to afford a protected acidic fluoroalcohol functional group. The fluoroalcohol functional group (protected or unprotected) of this invention can be used alone or it can be used in combination with one or more other acid groups, such as carboxylic acid functional group (unprotected) and t-butyl ester of carboxylic acid functional group (protected).

In this invention, often, but not always, the components having protected groups are repeat units having protected acid groups that have been incorporated in the base copolymer resins of the compositions (as discussed supra). Frequently the protected acid groups are present in one or more monomer(s) that are polymerized to form a given polymeric base resin of this invention. Alternatively, in this invention, a polymeric base resin can be formed by polymerization with an acid-containing monomer and then subsequently acid functionality in the resulting acid-containing polymer can be partially or wholly converted by appropriate means to derivatives having protected acid groups. As one specific example, a polymer of AN/IBFA/tBA (polymer containing acrylonitrile, 1,1,1-trifluoro-4-methyl-2-(trifluoromethyl)-4-penten-2-ol, and t-butyl acrylate) is a polymeric base resin within the scope of the invention having t-butyl ester groups as protected-acid groups.

Dissolution Inhibitors and Additives

Various dissolution inhibitors can be utilized in this invention. Ideally, dissolution inhibitors (DIs) for far and extreme UV resists (e.g., 193 nm resists) should be designed/chosen to satisfy multiple needs including dissolution inhibition, plasma etch resistance, and adhesion behavior of resist compositions comprising a given DI additive. Some dissolution inhibiting compounds also serve as plasticizers in resist compositions.

A variety of bile-salt esters (i.e., cholate esters) are particularly useful as DIs in the compositions of this invention. Bile-salt esters are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", J. Electrochem. Soc. 1983, 130, 1433–1437.) Bile-salt esters are particularly attractive choices as DIs for several reasons, including their availability from natural sources, their possessing a high alicyclic carbon content, and particularly for their being transparent in the deep and vacuum UV region, (which essentially is also the far and extreme UV region), of the electromagnetic spectrum (e.g., typically they are highly transparent at 193 nm). Furthermore, the bile-salt esters are also attractive DI choices since they may be designed to have widely ranging hydrophobic to hydrophilic compatibilities depending upon hydroxyl substitution and functionalization.

Representative bile-acids and bile-acid derivatives that are suitable as additives and/or dissolution inhibitors for this invention include, but are not limited to, those illustrated below, which are as follows: cholic acid (IV), deoxycholic acid (V), lithocholic acid (VI), t-butyl deoxycholate (VII), t-butyl lithocholate (VIII), and t-butyl-3-α-acetyl lithocholate (IX). Bile-acid esters, including compounds VII-IX, are preferred dissolution inhibitors in this invention.

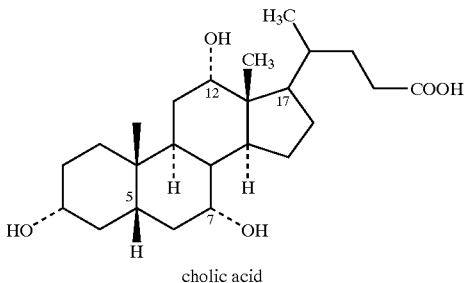

cholic acid deoxycholic acid lithocholic acid t-butyl deoxycholate t-butyl lithocholate

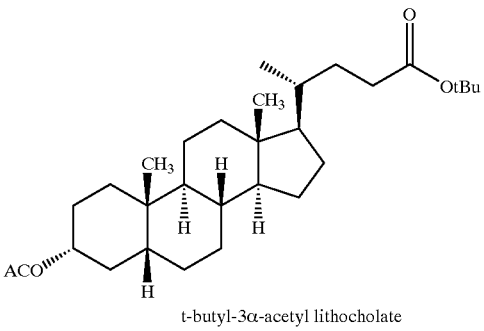

t-butyl-3α-acetyl lithocholate

Components for Negative-Working Photoresist Embodiment

Some embodiments of this invention are negative-working photoresists. These negative-working photoresists comprise at least one binder polymer comprised of acid-labile groups and at least one photoactive component that affords photogenerated acid. Imagewise exposure of the resist affords photogenerated acid which converts the acid-labile groups to polar functionality (e.g., conversion of ester functionality (less polar) to acidic functionality (more polar)). Development is then done in an organic solvent or critical fluid (having moderate to low polarity), which results in a negative-working system in which exposed areas remain and unexposed areas are removed.

A variety of different crosslinking agents can be employed as required or optional photoactive component(s) in the negative-working compositions of this invention. (A crosslinking agent is required in embodiments that involve insolubilization in developer solution as a result of crosslinking, but is optional in preferred embodiments that involve insolubilization in developer solution as a result of polar groups being formed in exposed areas that are insoluble in organic solvents and critical fluids having moderate/low polarity).

Other Components

The compositions of this invention can contain optional additional components. Examples of additional components which can be added include, but are not limited to, resolution enhancers, adhesion promoters, residue reducers, coating aids, surfactants, plasticizers, and $T_g$ (glass transition temperature) modifiers.

Process Steps

Imagewise Exposure

The photoresist compositions of this invention are sensitive in the ultraviolet region of the electromagnetic spectrum and especially to those wavelengths ≦365 nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, more preferably it is done with ultraviolet light of 193 nm, 157 nm, or lower wavelengths, and most preferably, it is done with ultraviolet light of 157 nm or lower wavelengths. Imagewise exposure can either be done digitally with a laser or equivalent device or non-digitally with use of a photomask. Suitable laser devices for digital imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. Since, as discussed supra, use of UV light of lower wavelength for imagewise exposure corresponds to higher resolution (lower resolution limit), the use of a lower wavelength (e.g., 193 nm or 157 nm or lower) is generally preferred over use of a higher wavelength (e.g., 248 nm or higher).

Development

The nitrile/fluoroalcohol-containing polymers in the resist compositions of this invention must contain sufficient functionality for development following imagewise exposure to UV light. Preferably, the functionality is acidic or protected acidic such that aqueous development is possible using a basic developer such as sodium hydroxide solution, potassium hydroxide solution, or tetramethylammonium hydroxide solution. In this invention, a given acidic-containing binder polymer for aqueous processability (aqueous development) in use is a fluoroalcohol-containing copolymer (after exposure) containing at least one fluoroalcohol functional group. The level of fluoroalcohol groups is determined for a given composition by optimizing the amount needed for good development in aqueous alkaline developer.

When an aqueous processable photoresist is coated or otherwise applied to a substrate and imagewise exposed to UV light, the polymer of the photoresist must have sufficient protected and/or unprotected acidic groups so that when exposed to UV the exposed photoresist will become developable in basic solution. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds) or 1% sodium carbonate by weight (with development at a temperature of 30° C. usually for less than 2 or equal to 2 minutes). In case of a negative-working photoresist layer, the photoresist layer will be removed during development in portions which are unexposed to UV radiation but will be substantially unaffected in exposed portions during development using either a critical fluid or an organic solvent.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmospheres below the critical pressure of the fluid. Carbon dioxide may be used for the critical fluid in the present invention. Various organic solvents can also be used as developer in this invention. These include, but are not limited to, halogenated solvents and nonhalogenated solvents. Halogenated solvents are preferred and fluorinated solvents more preferred.

| GLOSSARY | |
|---|---|
| Analytical/Measurements | |
| δ | NMR chemical shift measured in the indicated solvent |
| g | gram |
| NMR | Nuclear Magnetic Resonance |
| $^1$H NMR | Proton NMR |
| $^{13}$C NMR | Carbon-13 NMR |
| s | singlet |
| m | multiplet |
| ml | milliliter(s) |
| mm | millimeter(s) |
| $T_g$ | Glass Transition Temperature |
| $M_n$ | Number-average molecular weight of a given polymer determined by gel permeation chromatography using polystyrene standard |
| $M_w$ | Weight-average molecular weight of a given polymer determined by gel permeation chromatography using polystyrene standard |
| $P = M_w/M_n$ | Polydispersity of a given polymer |
| Absorption coefficient | AC = A/b, where A, absorbance, = $Log_{10}(1/T)$ and b = film thickness in microns, where T = transmittance as defined below. |
| Transmittance | Transmittance, T, = ratio of the radiant power transmitted by a sample to the radiant power incident on the sample and is measured for a specified wavelength λ (e.g., nm). |
| Chemicals/Monomers | |
| AA | Acrylic acid<br>Aldrich Chemical Co., Milwaukee, WI |
| AIBN | 2,2'-azobisisobutyronitrile<br>Aldrich Chemical Co., Milwaukee, WI |
| CFC-113 | 1,1,2-Trichlorotrifluoroethane<br>(E. I. du Pont de Nemours and Company, Wilmington, DE) |
| IBFA | 1,1,1-Trifluoro-4-methyl-2-(trifluoromethyl)-4-penten-2-ol |

-continued

| GLOSSARY | |
|---|---|
| MAA | Methacrylic acid |
| | Aldrich Chemical Co., Milwaukee, WI |
| MEK | 2-Butanone |
| | Aldrich Chemical Co., Milwaukee, WI |
| NB | Norbornene = Bicyclo[2.2.1]hept-2-ene |
| | Aldrich Chemical Co., Milwaukee, WI |
| NBFA | 3-[(Bicyclo[2.2.1]hept-5-en-2-yl)methoxy]-1,1,1-trifluoro-2-(trifluoromethyl)-2-propanol |
| THF | Tetrahydrofuran |
| | Aldrich Chemical Co., Milwaukee, WI |
| tBA | Tertiary-Butyl acrylate |
| TCB | Trichlorobenzene |
| | Aldrich Chemical Co., Milwaukee, WI |
| Vazo ® 52 | 2,4-Dimethyl-2,2'-azobis(pentanenitrile) |
| | (E. I. du Pont de Nemours and Company, Wilmington, DE) |
| Vazo ® 67 | 2,2'-Azobis(2-methyl butyronitrile) |
| | (E. I. du Pont de Nemours and Company, Wilmington, DE) |
| PGMEA | Propylene glycol methyl ether acetate |
| | Aldrich Chemical Co., Milwaukee, WI |
| NB—Me—OH | X = OH |
| NB—Me—F—OH | X = OCH$_2$C(CF$_3$)$_2$OH |
| NB—Me—F—OMOM | X = OCH$_2$C(CF$_3$)$_2$OCH$_2$OCH$_3$ |
| NB—OAc | X = OCOCH$_3$ |
| NB—OH | X = OH |
| NB—F—OH | X = OCH$_2$C(CF$_3$)$_2$OH |
| NB—F—OMOM | X = OCH$_2$C(CF$_3$)$_2$OCH$_2$OCH$_3$ |
| VE—F—OH | CH$_2$=CHOCH$_2$CH$_2$OCH$_2$C(CF$_3$)$_2$OH |
| VE—F—OMOM | CH$_2$=CHOCH$_2$CH$_2$OCH$_2$C(CF$_3$)$_2$OCH$_2$OCH$_3$ |
| | Ultraviolet |
| UV | Ultraviolet region of the electromagnetic spectrum which ranges from 10 nanometers to 390 nanometers |
| Extreme UV | Region of the electromagnetic spectrum in the ultraviolet that ranges from 10 nanometers to 200 nanometers |
| Far UV | Region of the electromagnetic spectrum in the ultraviolet that ranges from 200 nanometers to 300 nanometers |
| Near UV | Region of the electromagnetic spectrum in the ultraviolet that ranges from 300 nanometers to 390 nanometers |
| | Polymers |
| P(A/B/C)X/Y/Z | Polymer from copolymerization of A, B, and C containing X mole % of A, Y mole % of B, and Z mole % of C |
| P(AN/IBFA/NBFA) | Poly(acrylonitrile-co-1,1,1-trifluoro-4-methyl-2-(trifluoromethyl)-4-penten-2-ol-co-3-[(bicyclo[2.2.1]hept-5-en-2-yl)methoxy]-1,1,1-trifluoro-2-(trifluoromethyl)-2-propanol) (Polymer from copolymerization of acrylonitrile, comonomer 3, and comonomer 2) |
| P(AN/NBFA) | Poly(acrylonitrile-co-3-[(bicyclo[2.2.1]hept-5-en-2-yl)methoxy]-1,1,1-trifluoro-2-(trifluoromethyl)-2-propanol) (Polymer from copolymerization of acrylonitrile and comonomer 2) |
| P(AN/IBFA/NBFA/tBA) | Poly(acrylonitrile-co-1,1,1-trifluoro-4-methyl-2-(trifluoromethyl)-4-penten-2-ol-co-3-[(bicyclo[2.2.1]hept-5-en-2-yl)methoxy]-1,1,1-trifluoro-2-(trifluoromethyl)-2-propanol-co-t-butyl acrylate) (Polymer from copolymerization of acrylonitrile, comonomer 3, t-butyl acrylate and comonomer 2) |
| P(AN/NB—F—OMOM/MAA) | Poly(acrylonitrile-co-methoxymethylnorbornylenehexafluoroalcohol ether adduct-co-methacrylic acid) |

| | -continued |
|---|---|
| | GLOSSARY |
| | (Polymer from copolymerization of acrylonitrile, NB—F—OMOM, and methacrylic acid) |
| P(AN/NB—F—OH/tBMA) | Poly(acrylonitrile-co-norbornylenehexafluoroalcohol adduct-co-tertiary-butyl methacrylate) (Polymer from copolymerization of acrylonitrile, NB—F—OH, and tertiary-butyl methacrylate) |
| P(AN/NB—F—OMOM/ MAA/tBMA) | Poly(acrylonitrile-co-methoxymethyl-norbornylenehexafluoroalcoholether adduct -co-methacrylic acid-co-tertiary-butylmethacryate) (Polymer from copolymerization of acrylonitrile, NB—F—OMOM, methacrylic acid, and tertiary-butyl methacrylate) |

EXAMPLES

Unless otherwise specified, all temperatures are in degrees Centigrade, all mass measurements are in grams, and all percentages, with the exception of comonomer percentages, are weight percentages. All percentages of monomers present in the polymers of this invention are expressed in mole percentages unless otherwise indicated. All molecular weight determinations were made by GPC using polystyrene standard. Comonomer percentages in the polymers utilized in the examples are accurate within 5–10 percent and were determined by C-13 NMR spectroscopy.

The term "clearing dose" as used herein indicates the minimum exposure energy density (e.g., in units of $mJ/cm^2$) to enable a given photoresist film, following exposure, to undergo development.

Transparency Measurements

Two film samples of different thicknesses were made for a given polymer, their thicknesses determined, and their absorption coefficient values at 157 nm determined using the following general procedure:

Samples were first spin coated on silicon wafers on a Brewer Cee (Rolla, Mo.), Spincoater/Hotplate model 100CB.

a) Two to four silicon wafers were spun at different speeds (e.g. 2000, 3000, 4000, 6000 rpm), after small quantities (several ml) of the polymer solution was applied, to obtain films of differing thickness which were subsequently baked at 120° C. for 30 minutes to remove residual solvent. The thicknesses of the dried films were then measured using a Gaertner Scientific (Chicago, Ill.), L116A Ellipsometer. (400 to 1200 angstrom range).

b) Two $CaF_2$ substrates (1"(2.54 cm) diameter×0.80"(2.03 cm) thickness) were selected and each was measured to obtain reference data files. The measurements were made using a McPherson Spectrometer (Chemsford, Mass.), which included a 234/302 monochrometer, a 632 Deuterium Light Source, and a 658 photomultiplier detector whose output was measured using a Keithley 485 picoammeter.

c) Then two speeds were selected from the silicon wafer data (a) to spin the sample material onto the $CaF_2$ reference substrates (e.g. 2000 and 4000 rpm) to achieve the desired film thicknesses. Then each film and substrate was baked at 120° C. for 30 minutes after which the sample transmission data file of each was collected using the McPherson Spectrometer. Then the sample files were adjusted (i.e., divided) by the reference $CaF_2$ files to give transmittance files (i.e., sample film on $CaF_2$ divided by $CaF_2$ blank). The transmittance files were then converted to absorbance files using GRAMS386 and KALEIDAGRAPH software.

d) The resulting absorbance files from c) and film thickness values were then used to determine absorbance per micron of film thickness (AC) as is reported infra for certain examples.

Example 1

Preparation of 1,1-Bis(trifluoromethyl)ethylene Oxide

Hexafluoroisobutene $CH_2=C(CF_3)_2$ (25 ml, 40 g) was condensed in a flask containing a solution of NaOCl (made at −5 to −3° C. by bubbling 15 g of chlorine into solution of 50 ml of 50 wt. % of NaOH in 100 ml of water) and 0.5 g of phase transfer catalyst—methyl tricaprylyl ammonium chloride—was added at −2 to +2° C. under vigorous stirring. Reaction mixture was kept at this temperature for 1–1.5 hours.

The resulting reaction mixture was transferred out of the reactor in vacuum, collected in a cold trap (at −78° C.) and distilled to give 37.5 g (yield 86%) of liquid, b.p. 42° C./760 mm Hg, which was identified as 1,1-bis(trifluoromethyl) ethylene oxide (1). The resulting compound (1) was established to have the indicated structure based upon the analytical data obtained as indicated below.

$^1H$ NMR: 3.28 (s) ppm; $^{19}F$ NMR: 73.34 (s) ppm; $^{13}C$ {H} NMR: 46.75 (s), 54.99 (sept, 37 Hz), 126.76 (q, 275); IR (gas, major): 1404 (s), 1388 (s), 1220 (s), 1083 (s), 997 (m), 871 (m), 758 (w), 690 (m), 636 (w) cm-1; Anal. Calcd for $C_4H_2F_6O$: C, 26.68, H, 1.12. Found: C, 27.64, H, 1.10.

Example 2

Synthesis of

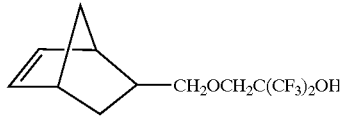

3-[(Bicyclo[2.2.1]hept-5-en-2-yl)methoxy]-1,1,1-trifluoro-2-(trifluoromethyl)-2-propanol (Comonomer 2, NBFA)

A dry round bottom flask with mechanical stirrer and condenser was charged under nitrogen with 28.8 g (1.2 mol) of 95% sodium hydride and 400 ml of anhydrous DMF (N,N'-dimethylformamide). 5-Norbornene-2-methanol (108.6 g, 0.875 mol) was added dropwise at room temperature over 0.5 hr. The resulting mixture was stirred for 3 hr. 1,1-Bis(trifluoromethyl)ethylene oxide (1, Hexafluoroisobutylene epoxide) (173.2 g, 0.96 mol) from Example 1 was added dropwise over 2 hr. The resulting mixture was stirred for 72 hr at room temperature. DMF was evaporated on a rotary evaporator at 45° C. and 1 mm. The residue was diluted with 300 ml of ice water containing 30 ml of glacial acetic acid. A lower layer was separated and the aqueous layer was extracted with 2×25 ml of methylene chloride. The combined organic layers were washed with 3×100 ml of water, dried over anhydrous magnesium chloride, filtered and distilled under vacuum in a Kugelrohr apparatus at 65–87° C. and 0.1 mm. An NMR spectrum revealed that the product was contaminated with small amounts of DMF so it was dissolved in 100 ml of hexane, washed with 4×200 ml water, dried over anhydrous magnesium sulfate, filtered and distilled in a Kugelrohr apparatus at 70–80° C. and 0.1 mm giving 233.9 g (88%) of the title product (3-[(bicyclo[2.2.1] hept-5-en-2-yl)methoxy]-1,1,1-trifluoro-2-(trifluoromethyl)-2-propanol, comonomer 2). In another preparation, the product was distilled through a 12" Vigreux column indicating a bp of 52–53° C. at 0.1 mm. $^1$H NMR ($\delta$, $CD_2Cl_2$) 0.5 to 4.3 (complex multiplets, 12 H), 5.90, 6.19 and 6.26 (m, 2H). $^{19}$F NMR ($\delta$, $CD_2Cl_2$) −77.4 (s).

Example 3

Synthesis of $CH_2=C(CH_3)CH_2C(CF_3)_2OH$ (1,1,1-Trifluoro-4-methyl-2-(trifluoromethyl)-4-penten-2-ol, comonomer 3, IBFA)

An 800 ml pressure vessel was evacuated, cooled to about −80° C. and charged with 100 g (0.6 mol) of hexafluoroacetone and 68 g (1.2 mol) of 2-methylpropene. The mixture was agitated for 72 hr at room temperature. The vessel was cooled to about 10IC and slowly vented to atmospheric pressure. The liquid residue was removed using a small amount of methylene chloride to rinse. This mixture was distilled rapidly through a 12" Vigreux column at about 200 mm to give 136 g of crude product. This was combined with the product from another reaction on the same scale and distilled through a 12" Vigreux column giving 210 g (79%) of product, which was characterized to be compound 3: bp 72° C. at 200 mm. $^1$H NMR ($\delta$, $C_6D_6$) 1.51 (s, 3H), 2.30 (s, 2H), 2.57 (bs, 1H), 4.5 (s, 1H), 4.70 (s, 1H). $^{19}$F NMR ($\delta$, $C_6D_6$) −76.9 (s).

Example 4

P(AN/IBFA/NBFA) (68/10/22) (Mole Percentages)

This polymer was synthesized by free radical copolymerization of acrylonitrile, 1,1,1-trifluoro-4-methyl-2-(trifluoromethyl)-4-penten-2-ol (IBFA, comonomer 3), and 3-[(bicyclo[2.2.1]hept-5-en-2-yl)methoxy]-1,1,1-trifluoro-2-(trifluoromethyl)-2-propanol (NBFA, comonomer 2) using the procedure which follows. The following components were charged into a 100 ml flask equipped with a thermocouple, stirrer, dropping funnels, reflux condenser, Dean-Stark trap and the means for bubbling nitrogen through the reaction.

| Parts by Weight | Grams |
| --- | --- |
| Portion 1 | |
| IBFA | 11.1 |
| NBFA | 22.5 |
| AN | 6.63 |
| 2, 2'-Azobis (2-methyl butyronitrile) (Vazo ®-67) | 0.0839 |
| MEK | 10.0 |
| Portion 2 | |
| MEK | 17.0 |
| 2, 2'-Azobis (2, 4-dimethyl valeronitrile) (Vazo ®-52) | 0.68 |
| TOTAL | 40.23 |

Vazo®-67 initiator (part of portion 1) was dissolved with 2 ml of MEK (part of portion 1). All of the remaining ingredients of portion 1 were added into the 100 ml reaction flask except 2 ml of MEK and, the resulting mixture was then raised to its reflux temperature. Then the initiator solution was added as one shot into the flask. The initiator container was rinsed with the remaining 2 ml of MEK and added into the reaction flask. Immediately following the Vazo®-67 initiator shot, portion 2 Vazo®-52 was thoroughly dissolved in MEK and fed over 300 minutes at reflux temperature. The solvent was then stripped to remove the unreacted acrylonitrile. Then 20 ml of MEK was added and stripped again to remove the traces of acrylonitrile left in the polymer. The stripping procedure was repeated two more times by adding 20 ml of MEK each time in the reaction flask. Finally the polymer was precipitated by adding the polymer solution into large excess (300 ml) of petroleum ether. The precipitated polymer was filtered and washed twice with petroleum ether. The wet polymer was dried in a vacuum oven for 12 hours at 60° C. The yield was 7.15 gram (17.8%). The resulting polymer was characterized to have a molecular weight of 2610 ($M_n$) and a polydispersity of 1.37. The C-13 NMR analysis indicated that the copolymer composition (molar parts) is P(AN/IBFA/NBFA) (68/10/22 m/m/m).

Two film samples of different thicknesses were made of this polymer, their thicknesses determined, and their absorption coefficient values at 157 nm determined using the general procedure described above.

The first film sample had a thickness of 501 Å and exhibited an absorption coefficient of 2.91 at 157 nm. The second film sample had a thickness of 833 Å and exhibited an absorption coefficient of 3.18 at 157 nm.

Example 5

P(AN/IBFA/NBFA/tBA) (62/4/18/16) (Mole Percentages)

This polymer was synthesized by free radical copolymerization of acrylonitrile, 1,1,1-trifluoro-4-methyl-2-(trifluoromethyl)-4-penten-2-ol (comonomer 3), 3-[(bicyclo [2.2.1]hept-5-en-2-yl)methoxy]-1,1,1-trifluoro-2-

(trifluoromethyl)-2-propanol (comonomer 2), and t-butyl acrylate using the procedure which follows. The following components were charged into a 100 ml flask equipped with a thermocouple, stirrer, dropping funnels, reflux condenser, Dean-Stark trap and the means for bubbling nitrogen through the reaction.

| Parts by Weight | Grams |
|---|---|
| Portion 1 | |
| IBFA | 11.1 |
| NBFA | 22.5 |
| AN | 5.3 |
| tBA | 3.2 |
| 2, 2'-Azobis (2-Methyl Butyronitrile) (Vazo ®-67) | 0.0839 |
| MEK | 10.0 |
| Portion 2 | |
| MEK | 17.0 |
| 2, 2'-Azobis (2, 4-Dimethyl Valeronitrile) | 0.68 |
| (Vazo ®-52) | |
| TOTAL | 40.23 |

Vazo®-67 initiator (part of portion 1) was dissolved with 2 ml of MEK (part of portion 1). All of the remaining ingredients of portion 1 were added into the 100 ml reaction flask except 2 ml of MEK and the resulting reaction mixture was raised to its reflux temperature. Then the initiator solution was added as one shot into the flask. The initiator container was rinsed with the remaining 2 ml of MEK and added into the reaction flask. Immediately following the Vazo®-67 initiator shot, portion 2 Vazo®-52 was thoroughly dissolved in MEK and fed over 300 minutes at reflux temperature. The solvent was then stripped to remove the unreacted acrylonitrile. Then 20 ml of MEK was added and stripped again to remove the traces of acrylonitrile left in the polymer. The stripping procedure was repeated two more times by adding 20 ml of MEK each time in the reaction flask. Finally, the polymer was precipitated by adding the polymer solution in MEK into large excess (300 ml) of petroleum ether. The precipitated polymer was filtered and washed twice with petroleum ether. The wet polymer was dried in a vacuum oven for 12 hours at 60° C. The yield was 10 gram (23.7%). The resulting polymer was found to have a molecular weight of 2,646 ($M_n$) and a polydispersity of 1.44. The C-13 nmR analysis indicated that the copolymer composition (molar parts) is P(AN/IBFA/NBFA/tBA) (62/4/18/16 m/m/m/m).

The procedure as described supra was used to determine absorption coefficient values at 157 nm for two different film thicknesses of films made with this polymer. The first film sample had a thickness of 579 Å and exhibited an absorption coefficient of 3.98 at 157 nm. The second film sample had a thickness of 702 Å and exhibited an absorption coefficient of 3.77 at 157 nm.

Example 6

A solution of the following ingredients was prepared and magnetically stirred overnight.

| Component | Wt. (gm) |
|---|---|
| Acrylonitrile fluoroalcohol polymer | 1.16 |
| described in Example 5 | |
| P(AN/IBFA/NBFA/tBA) 62/4/18/16 (mole percentage of each comonomer in order as indicated) | |
| Propylene glycol methyl ether acetate (PGMEA) | 8.1 |
| 5% (wt) solution of triphenylsulfonium triflate dissolved in cyclohexanone which had been filtered through a 0.45 µ PTFE syringe filter. | 0.72 |

Spin coating of the above solution was done using a Brewer Science Inc. Model-100CB combination spin coater/hotplate on a 4 inch diameter silicon wafer, Type "P", 1.00 orient. Development was performed on a Litho Tech Japan Co. Resist Development Analyzer (Model-790) (Litho Tech Japan Co., Kawaguchi, Saitama, Japan).

The wafer was prepared by depositing 6 ml of hexamethyldisilazane (HMDS) primer and spinning at 1000 revolutions per minute (rpm) for 5 seconds and then at 3500 rpm for 10 seconds. Then 4 ml of the above solution, after filtering through a 0.45 PTFE (poly(tetrafluoroethylene)) syringe filter, was deposited and spun at 3000 rpm for 60 seconds and baked at 120° C. for 60 seconds. The coated wafer was exposed to 248 nm light obtained by passing broadband ultraviolet (UV) light from an ORIEL Model-82421 Solar Simulator (1000 watt) through a 248 nm interference filter which passes about 30% of the energy at 248 nm. Exposure time was 300 seconds, providing a dose of 205.0 mJ/cm$^2$, through a mask with 18 positions of varying neutral optical density to allow various exposure doses. The exposed wafer was then baked at 100° C. for 120 seconds. The wafer was developed for a total of 360 seconds (intervals of 60 and 300 seconds) at 22° C. in aqueous tetramethylammonium hydroxide (TMAH) solution (ONKA NMD-3, 2.38% TMAH solution). Monitoring of the coating surface by the Model-790 Resist Development Analyzer gave evidence of formation of a positive image: i.e., exposed areas cleared in a total of about 120 seconds while unexposed areas cleared in a total of about 260–310 seconds.

Example 7

A solution of the following ingredients was prepared and magnetically stirred overnight.

| Component | Wt. (gm) |
|---|---|
| Acrylonitrile fluoroalcohol polymer described in Example 4 | 0.95 |
| P(AN/IBFA/NBFA) 68/10/22 (mole percentage of each comonomer in order as indicated) | |
| Propylene glycol methyl ether acetate (PGMEA) | 8.0 |
| t-Butyl Lithocholate | 0.21 |
| 5% (wt) solution of triphenylsulfonium triflate dissolved in cyclohexanone which had been filtered through a 0.45 µ PTFE syringe filter. | 0.81 |

Spin coating of the above solution was done using a Brewer Science Inc. Model-100CB combination spin coater/hotplate on a 4 inch diameter silicon wafer, Type "P", 1.00 orient. Development was performed on a Litho Tech Japan Co. Resist Development Analyzer (Model-790) (Litho Tech Japan Co., Kawaguchi, Saitama, Japan).

The wafer was prepared by depositing 6 ml of hexamethyldisilazane (HMDS) primer and spinning at 1000 rpm for 5 seconds and then at 3500 rpm for 10 seconds. Then 4 ml of the above solution, after filtering through a 0.45 PTFE syringe filter, was deposited and spun at 5000 rpm for 60 seconds and baked at 120° C. for 60 seconds. The coated wafer was exposed to 248 nm light obtained by passing broadband UV light from an ORIEL Model-82421 Solar Simulator (1000 watt) through a 248 nm interference filter which passes about 30% of the energy at 248 nm. Exposure time was 30 seconds, providing a dose of 20.5 mJ/cm$^2$, through a mask with 18 positions of varying neutral optical density to allow various exposure doses. The exposed wafer was then baked at 120° C. for 120 seconds. The wafer was developed in aqueous tetramethylammonium hydroxide (TMAH) solution (ONKA NMD-3, 2.38% TMAH solution) for 60 seconds at 22° C. to give a positive image.

Example 8

Synthesis of NB-F-OH

A dry round bottom flask equipped with mechanical stirrer, addition funnel and nitrogen inlet was swept with nitrogen and charged with 19.7 g (0.78 mol) of 95% sodium hydride and 500 ml of anhydrous DMF. The stirred mixture was cooled to 5° C. and 80.1 g (0.728 mol) of exo-5-norbornen-2-ol was added dropwise so that the temperature remained below 15° C. The resulting mixture was stirred for ½ hr. HFIBO (131 g, 0.728 mol) was added dropwise at room temperature. The resulting mixture was stirred overnight at room temperature. Methanol (40 ml) was added and most of the DMF was removed on a rotary evaporator under reduced pressure. The residue was treated with 200 ml water and glacial acetic acid was added until the pH was about 8.0. The aqueous mixture was extracted with 3×150 ml ether. The combined ether extracts were washed with 3×150 ml water and 150 ml brine, dried over anhydrous sodium sulfate and concentrated on a rotary evaporator to an oil. Kugelrohr distillation at 0.15–0.20 torr and a pot temperature of 30–60° C. gave 190.1 (90%) of product. $^1$H NMR (δ, CD$_2$Cl$_2$) 1.10 –1.30 (m, 1H), 1.50 (d, 1H), 1.55–1.65 (m, 1H), 1.70 (s, 1H), 1.75 (d, 1H), 2.70 (s, 1H), 2.85 (s, 1H), 3.90 (d, 1H), 5.95 (s, 1H), 6.25 (s, 1H). Another sample prepared in the same fashion was submitted for elemental analysis. Calcd. for C$_{11}$H$_{12}$F$_6$O$_2$: C, 45.53; H, 4.17; F, 39.28. Found: C, 44.98; H, 4.22; F, 38.25.

Example 9

Synthesis of NB-F-OMOM

A dry round bottom flask equipped with magnetic stirrer, addition funnel, thermocouple and nitrogen inlet was charged with 5.05 g (0.2 mol) of 95% sodium hydride and 200 ml THF. The mixture was cooled to 0° C. and 55.7 g (0.192 mol) NB-F-OH was added dropwise resulting in H$_2$ evolution and an exotherm to 6° C. The mixture was stirred for 2 hr giving a yellow homogeneous solution. Chloromethyl methyl ether (15.2 ml, 0.2 mol) (Aldrich Chemical Company) was added dropwise. The resulting mixture was stirred overnight with formation of a precipitate. The mixture was filtered and the solid was washed with 3×50 ml THF. The combined filtrate and washings were concentrated on a rotary evaporator to a yellow oil. Distillation of the oil in a Kugelrohr apparatus at 30–47° C. and 0.13 torr gave, after a small foreshot, 47.1 g (73%) of product. $^1$H NMR (δ, CDCl$_3$) 1.40 (m, 1H), 1.58 (m, 2H), 1.68 (m, 2H), 2.78 (s, 1H), 2.90 (s, 1H), 3.45 (s, 3H), 3.50 (m, 1H), 4.08 (dd, 1H), 5.08 (s, 2H), 5.96 (m, 1H), 6.11 (m, 1H). $^{19}$F NMR (δ, CDCl$_3$) –76.8 (s). Another sample prepared in the same fashion was submitted for elemental analysis. Calcd. for C$_{13}$H$_{16}$F$_6$O$_3$: C, 46.71; H, 4.82; F, 34.10. Found: C, 46.26; H, 5.03; F, 32.01.

Example 10

P(AN/NB-F-OMOM/MAA) (50/28/22) (Mole Percentages)

The acrylonitrile(AN)/methoxymethylnorbomylenehexafluoroalcohol ether adduct (NB-F-OMOM)/methacrylic acid (MAA) copolymer was prepared by charging the following components to a 100 ml flask equipped with a thermocouple, stirrer, dropping funnels, reflux condenser, Dean-Stark trap and the means for bubbling nitrogen through the reaction.

| Parts by Weight | Grams |
| --- | --- |
| Portion 1 | |
| Methoxymethylnorbornylenehexafluoroalcohol ether adduct NB-F-OMOM) | 24.079 |
| Acrylonitrile (AN) | 0.324 |
| 2, 2'-Azobis (2-Methyl Butyronitrile): Vazo ®-67 | 0.150 |
| Acetone | 3.169 |
| Portion 2 | |
| Acrylonitrile | 2.917 |
| 2, 2'-Azobis (2, 4-Dimethyl Valeronitrile): Vazo ®-52 | 0.60 |
| Methacrylic acid (MAA) | 0.941 |
| Acetone | 8.639 |
| Portion 3 | |
| Vazo ®-52 | 0.150 |
| Acetone | 2.85 |
| Total | 43.819 |

Vazo®-67 initiator (part of portion 1) was dissolved with 2 gm of acetone (part of portion 1). All the remaining ingredients of portion 1 was added into the 100 ml reaction flask and heated to reflux temperature. Then the initiator solution was added as one shot into the flask. The initiator container was rinsed with the remaining 1. 169 g of acetone and added into the reaction flask. Immediately following the Vazo®-67 initiator shot, portion 2 monomers and initiator dissolved in acetone and fed over 240 minutes at reflux temperature. After the feed was over, portion 3 initiator dissolved in acetone was added as a shot into the reaction flask. The reaction was continued at reflux for another 90 minutes. The solvent was then stripped to remove the unreacted acrylonitrile. Then 18 ml of acetone was added and stripped again to remove the traces of acrylonitrile left in the polymer. The stripping procedure was repeated three more times by adding 18 ml of acetone each time in the reaction flask. Finally the polymer was precipitated by adding the polymer solution into large excess (700 grams) of petroleum ether. After decanting the solvents, the white polymer powder was rinsed with small amount of petroleum ether and decanted. The wet polymer was dried in a vacuum oven for 12 hours at 40° C. The C-13 nmR analysis indicated that the copolymer composition (molar parts) is P(AN/NB-F-OMOM/MAA) (50.6/27.9/21.6 m/m/m).

The procedure as described supra was used to determine absorption coefficient values at 157 nm for two different film thicknesses of films made with this polymer. The first film sample had a thickness of 505 Å and exhibited an absorption coefficient of 3.33 $\mu m^{-1}$ at 157 nm. The second film sample had a thickness of 837 Å and exhibited an absorption coefficient of 3.61 $\mu m^{-1}$ at 157 nm. The average of these two values is 3.47 $\mu m^{-1}$.

Example 11

P(AN/NBFOH/tBMA) (65/22/13) (Mole Percentages)

The acrylonitrile(AN)/norbornylenehexafluoroalcohol adduct (NB-F-OH/tertiary butyl methacrylate (t-BMA) copolymer was prepared by charging the following components to a 100 ml flask equipped with a thermocouple, stirrer, dropping funnels, reflux condenser, Dean-Stark trap and the means for bubbling nitrogen through the reaction.

| Parts by Weight | Grams |
| --- | --- |
| Portion 1 | |
| Norbornylenehexafluoroalcohol adduct (NB-F-OH) | 21.553 |
| Acrylonitrile (AN) | 0.324 |
| 2, 2'-Azobis (2-Methyl Butyronitrile): Vazo ®-67 | 0.150 |
| Acetone | 3.169 |
| Portion 2 | |
| Acrylonitrile | 2.917 |
| 2, 2'-Azobis (2,4-Dimethyl Valeronitrile): Vazo ®-52 | 0.60 |
| Tertiarybutyl methacrylate (t-BMA) | 1.554 |
| Acetone | 8.639 |
| Portion 3 | |
| Vazo ®-52 | 0.150 |
| Acetone | 2.85 |
| Total | 41.906 |

Vazo®-67 initiator (part of portion 1) was dissolved with 2 gm of acetone (part of portion 1). All the remaining ingredients of portion 1 was added into the 100 ml reaction flask and heated to reflux temperature. Then the initiator solution was added as one shot into the flask. The initiator container was rinsed with the remaining 1.169 g of acetone and added into the reaction flask. Immediately following the Vazo®-67 initiator shot, portion 2 monomers and initiator dissolved in acetone and fed over 240 minutes at reflux temperature. After the feed was over, portion 3 initiator dissolved in acetone was added as a shot into the reaction flask. The reaction was continued at reflux for another 90 minutes. The solvent was then stripped to remove the unreacted acrylonitrile. Then 18 ml of acetone was added and stripped again to remove the traces of acrylonitrile left in the polymer. The stripping procedure was repeated three more times by adding 18 ml of acetone each time in the reaction flask. Finally the polymer was precipitated by adding the polymer solution into large excess (700 grams) of petroleum ether. After decanting the solvents, the white polymer powder was rinsed with small amount of petroleum ether and decanted. The wet polymer was dried in a vacuum oven for 12 hours at 50° C. The yield was 7.86 grams (29.8%). The C-13 nmR analysis indicated that the copolymer composition (molar parts) is P(AN/NB-F-OH/t-BMA) (65.3/21.7/13.0 m/m/m).

The procedure as described supra was used to determine absorption coefficient values at 157 nm for two different film thicknesses of films made with this polymer. The first film sample had a thickness of 644 Å and exhibited an absorption coefficient of 3.35 $\mu m^{-1}$ at 157 nm. The second film sample had a thickness of 605 Å and exhibited an absorption coefficient of 3.38 $\mu m^{-1}$ at 157 nm. The average of these two values is 3.37 $\mu m^{-1}$.

Example 12

P(AN/NB-F-OMOM/MAA/tBMA) (52/18/15/15) (Mole Percentages)

The acrylonitrile(AN)/methoxymethylnorbornylenehexafluoroalcohol ether adduct (NB-F-OMOM)/methacrylic acid (MAA)/tertiary-butyl methacrylate (tBMA) copolymer was prepared by charging the following components to a 100 ml flask equipped with a thermocouple, stirrer, dropping funnels, reflux condenser, Dean-Stark trap and the means for bubbling nitrogen through the reaction.

| Parts by Weight | Grams |
| --- | --- |
| Portion 1 | |
| Methoxymethylnorbornylenehexafluoroalcohol ether adduct (NB-F-OMOM) | 24.079 |
| Acrylonitrile (AN) | 0.285 |
| Tertiarybutyl methacrylate (tBMA) | 0.104 |
| 2, 2'-Azobis (2-Methyl Butyronitrile): Vazo ®-67 | 0.150 |
| Acetone | 3.169 |
| Portion 2 | |
| Acrylonitrile | 2.566 |
| 2, 2'-Azobis (2,4-Dimethyl Valeronitrile): Vazo ®-52 | 0.60 |
| Methacrylic acid (MAA) | 0.941 |
| Tertiarybutyl methacrylate (tBMA) | 0.132 |
| Acetone | 8.639 |
| Portion 3 | |
| Vazo ®-52 | 0.150 |
| Acetone | 2.85 |
| Total | 43.665 |

Vazo®-67 initiator (part of portion 1) was dissolved with 2 grams of acetone (part of portion 1). All the remaining ingredients of portion 1 was added into the 100 ml reaction flask and heated to reflux temperature. Then the initiator solution was added as one shot into the flask. The initiator container was rinsed with the remaining 1.169 g of acetone and added into the reaction flask. Immediately following the Vazo®-67 initiator shot, portion 2 monomers and initiator dissolved in acetone and fed over 240 minutes at reflux temperature. After the feed was over, the reaction was continued for 45 minutes at reflux and then portion 3 initiator dissolved in acetone was added as a shot into the reaction flask. The reaction was continued at reflux for another 45 minutes. The solvent was then stripped to remove the unreacted acrylonitrile. Then 18 ml of acetone was added and stripped again to remove the traces of acrylonitrile left in the polymer. The stripping procedure was repeated three more times by adding 18 ml of acetone each time in the reaction flask. Finally the polymer was precipitated by adding the polymer solution into large excess (650 ml) of petroleum ether. After decanting the solvents, the white polymer powder was rinsed with small amount of petroleum ether and decanted. The wet polymer was dried in a vacuum oven for 12 hours at 45° C. The yield was 6.19 grams (21.9%). The C-13 nmR analysis indicated that the copolymer composition (molar parts) is P(AN/NB-F-OMOM/MAA/tBMA) (52.0/18.7/15.4/14.0 m/m/m/m).

The procedure as described supra was used to determine absorption coefficient values at 157 nm for two different film thicknesses of films made with this polymer. The first film sample had a thickness of 683 Å and exhibited an absorption coefficient of 3.88 μm$^{-1}$ at 157 nm. The second film sample had a thickness of 625 Å and exhibited an absorption coefficient of 3.96 μm$^{-1}$ at 157 nm. The average of these two values is 3.92 μm$^{-1}$.

Example 13

A solution of the following ingredients was prepared and magnetically stirred overnight.

| Component | Wt. (gm) |
| --- | --- |
| P(AN/NB-F-OMOM/MAA) 50/28/22 (mole percentage of each comonomer in order as indicated) (Copolymer described in Example 10) | 0.580 |
| 2-Heptanone | 5.121 |
| t-Butyl Lithocholate | 0.120 |
| 6.82% (wt) solution of triphenylsulfonium nonaflate dissolved in 2-heptanone which had been filtered through a 0.45 μ PTFE syringe filter. | 0.299 |

Spin coating was done using a Brewer Science Inc. Model-100CB combination spin coater/hotplate on a 4 inch diameter Type "P", 1.00 orientation, silicon wafer. Development was performed on a Litho Tech Japan Co. Resist Development Analyzer (Model-790).

The wafer was prepared by depositing 6 ml of hexamethyldisilazane (HMDS) primer and spinning at 5000 rpm for 10 seconds. Then about 3 ml of the above copolymer-containing solution, after filtering through a 0.45 μm PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 300 seconds, providing an unattenuated dose of 205 mJ/cm$^2$. By using a mask with 18 positions of varying neutral optical density, a wide variety of exposure doses were generated. After exposure the exposed wafer was baked at 120° C. for 120 seconds.

The wafer was developed in aqueous tetramethylammonium hydroxide (TMAH) solution (OHKA nmD-3, 2.38% TMAH solution) for 60 seconds to give a positive image.

Example 14

A solution of the following ingredients was prepared and magnetically stirred overnight.

| Component | Wt. (gm) |
| --- | --- |
| P(AN/NB-F-OMOM/MAA/tBMA) 52/18/15/15 (mole percentage of each comonomer in order as indicated) (Copolymer described in Example 12) | 0.460 |
| 2-Heptanone | 5.121 |
| t-Butyl Lithocholate | 0.120 |
| 6.82% (wt) solution of triphenylsulfonium nonaflate dissolved in 2-heptanone which had been filtered through a 0.45 μ PTFE syringe filter. | 0.299 |

Spin coating was done using a Brewer Science Inc. Model-100CB combination spin coater/hotplate on a 4 inch diameter Type "P", 1.00 orientation, silicon wafer. Development was performed on a Litho Tech Japan Co. Resist Development Analyzer (Model-790).

The wafer was prepared by depositing 6 ml of hexamethyldisilazane (HMDS) primer and spinning at 5000 rpm for 10 seconds. Then about 3 ml of the above solution, after filtering through a 0.45 μm PTFE syringe filter, was deposited and spun at 3000 rpm for 60 seconds and baked at 120° C. for 60 seconds.

248 mn imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 300 seconds, providing an unattenuated dose of 205 mJ/cm$^2$. By using a mask with 18 positions of varying neutral optical density, a wide variety of exposure doses were generated. After exposure the exposed wafer was baked at 120° C. for 120 seconds.

The wafer was developed in aqueous tetramethylammonium hydroxide (TMAH) solution (OHKA NMD-3, 2.38% TMAH solution) for 60 seconds to give a positive image.

Example 15

A solution of the following ingredients was prepared and magnetically stirred overnight.

| Component | Wt. (gm) |
| --- | --- |
| P(AN/NB-F-OH/tBMA) 65/22/13 (mole percentage of each comonomer in order as indicated) (Copolymer described in Example 11) | 0.580 |
| 2-Heptanone | 5.121 |
| t-Butyl Lithocholate | 0.120 |
| 6.82% (wt) solution of triphenylsulfonium nonaflate dissolved in 2-heptanone which had been filtered through a 0.45 μ PTFE syringe filter. | 0.299 |

Spin coating was done using a Brewer Science Inc. Model-100CB combination spin coater/hotplate on a 4 inch diameter Type "P", 1.00 orientation, silicon wafer. Development was performed on a Litho Tech Japan Co. Resist Development Analyzer (Model-790).

The wafer was prepared by depositing 6 ml of hexamethyldisilazane (HMDS) primer and spinning at 5000 rpm for 10 seconds. Then about 3 ml of the above copolymer-containing solution, after filtering through a 0.45 μm PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 300 seconds, providing an unattenuated dose of 205 mJ/cm$^2$. By using a mask with 18 positions of varying neutral optical density, a wide variety of exposure doses were generated. After exposure the exposed wafer was baked at 110° C. for 100 seconds.

The wafer was developed in aqueous tetramethylammonium hydroxide (TMAH) solution (OHKA NMD-3, 2.38% TMAH solution) for 60 seconds to give a positive image.

What is claimed is:

1. A photoresist comprising:
   (a) a polymer having:

(i) a repeat unit derived from at least one ethylenically unsaturated compound containing a fluoroalcohol functional group having the structure:

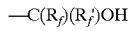
—C(R$_f$)(R$_f'$)OH wherein R$_f$ and R$_f'$ are the same or different fluoroalkyl groups of from 1 to about 10 carbon atoms or taken together are (CF$_2$)$_n$ wherein n is an integer ranging from 2 to about 10; and (ii) a repeat unit derived from at least one ethylenically unsaturated compound having the structure:

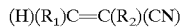
(H)(R$_1$)C=C(R$_2$)(CN)

wherein R$_1$ is a hydrogen atom or CN group, R$_2$ is an alkyl group of 1 to about 8 carbon atoms, hydrogen atom, or CO$_2$R$_3$ group wherein
R$_3$ is an alkyl group of 1 to about 8 carbon atoms or hydrogen atom; and (b) at least one photoactive component.

2. The photoresist of claim 1 wherein the polymer has an absorption coefficient of less than 5.0 μm$^{-1}$ at a wavelength of 157 mn.

3. The photoresist of claim 1 wherein the repeat unit derived from the at least one ethylenically unsaturated compound containing the fluoroalcohol functional group is present in the polymer from about 10 to about 60 mole percent and the repeat unit derived from the at least one ethylenically unsaturated compound containing at least one nitrile group is present in the polymer from about 20 to about 80 mole percent.

4. The photoresist of claim 1 wherein the repeat unit derived from the at least one ethylenically unsaturated compound containing the fluoroalcohol functional group is present in the polymer at less than or equal to about 45 mole percent.

5. The photoresist of claim 4 wherein the repeat unit derived from the at least one ethylenically unsaturated compound containing the fluoroalcohol functional group is present in the polymer at less than or equal to about 30 mole percent.

6. The photoresist of claim 1 which is a positive-working photoresist.

7. The photoresist of claim 1 which further comprises at least one protected functional group.

8. The photoresist of claim 1 wherein the repeat unit (ii) is derived from an ethylenically unsaturated compound selected from the group consisting of acrylonitrile, methacrylonitrile, trans-1,2-dicyanoethylene, and cis-1,2-dicyanoethylene.

9. The photoresist of claim 8 wherein the repeat unit (ii) is derived from acrylonitrile.

10. The photoresist of claim 7 wherein the functional group of the protected functional group is selected from the group consisting of carboxylic acid and fluoroalcohol.

11. The photoresist of claim 1 wherein at least one fluoroalcohol functional group is protected.

12. The photoresist of claim 1 in which the polymer further comprises an aliphatic polycyclic group.

13. The photoresist of claim 12 wherein the percentage of repeat units of the polymer containing aliphatic polycyclic group ranges from about 1 to about 50 mole percent.

14. The photoresist of claim 1 wherein the photoactive component is a photoacid generator.

15. The photoresist of claim 1 wherein the photoresist is developable so as to produce a relief image upon imagewise exposure to ultraviolet radiation having wavelength of <365 nm.

16. The photoresist of claim 1 further comprising at least one member selected from the group consisting of a carboxylic acid, a protected fluoroalcohol, and a protected carboxylic acid.

17. The photoresist of claim 1 further comprising a dissolution inhibitor.

18. The photoresist of claim 1 wherein the fluoroalcohol functional group has a pK$_a$ of less than or equal to 11.

19. The photoresist of claim 1 wherein the polymer is a branched polymer.

20. A process for preparing a photoresist image on a substrate comprising, in order:

(A) applying a photoresist composition on a substrate to form a photoresist layer, wherein the photoresist composition comprises:
(i) a polymer having:
(a) a repeat unit derived from at least one ethylenically unsaturated compound containing a fluoroalcohol functional group having the structure:

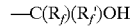
—C(R$_f$)(R$_f'$)OH wherein R$_f$ and R$_f'$ are the same or different fluoroalkyl groups of from 1 to about 10 carbon atoms or taken together are (CF$_2$)$_n$ wherein n is an integer ranging from 2 to about 10; and (b) a repeat unit derived from at least one ethylenically unsaturated compound having the structure:

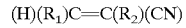
(H)(R$_1$)C=C(R$_2$)(CN)

wherein R$_1$ is a hydrogen atom or CN group, R$_2$ is an alkyl group of 1 to about 8 carbon atoms, hydrogen atom, or CO$_2$R$_3$ group wherein
R$_3$ is an alkyl group of 1 to about 8 carbon atoms or hydrogen atom; and;

(ii) at least one photoactive component;

(B) imagewise exposing the photoresist layer to form imaged and non-imaged areas; and (C) developing the exposed photoresist layer having imaged and non-imaged areas to form the photoresist image on the substrate.

21. The process of claim 20 further comprising, between steps (A) and (B), a step of drying the photoresist composition to substantially remove solvent and thereby form the photoresist layer on the substrate, wherein the photoresist composition is further comprised of a solvent.

22. The process of claim 20 further comprising a step of adding at least one protected functional group containing additive to the photoresist composition or protecting a functional group of the polymer followed by the step of heating the photoresist layer to promote deprotection for image formation.

23. The process of claim 20 wherein the exposed layer is developed with an aqueous alkaline developer.

24. The process of claim 20 further comprising adding a functional group to the polymer which functional group is selected from the group consisting of a carboxylic acid, a protected fluoroalcohol, and a protected carboxylic acid.

25. The photoresist of claim 1 further comprising a solvent.

26. The photoresist of claim 25 wherein the solvent is selected from the group consisting of cyclohexanone, propylene glycol methyl ether acetate, and 2-heptanone.

27. The photoresist of claim 25 wherein the solvent is cyclohexanone and propylene glycol methyl ether acetate in combination.

28. The process of claim 21 wherein the solvent is selected from the group consisting of cyclohexanone, propylene glycol methyl ether acetate, and 2-heptanone.

29. The process of claim 21 wherein the solvent is cyclohexanone and propylene glycol methyl ether acetate in combination.

30. The photoresist of claim 1 wherein the (a) repeat unit has the structural formula $XCH_2C(R_f)(R_f')OH$ wherein X is oxygen, sulfur, nitrogen or phosphorus and $R_f$ and $R_f'$ are the same or different fluoroalkyl group of 1 to 10 carbon atoms or taken together are $(CF_2)_n$ where n is an integer of 2 to about 10.

31. The photoresist of claim 1 wherein the (a) repeat unit is derived from a monomer having the structural formula:

$CH_2$=$CHOCH_2CH_2OCH_2C(CF_3)_2OH$, $CH_2$=$CHO(CH_2)_4OCH_2C(CF_3)_2OH$,

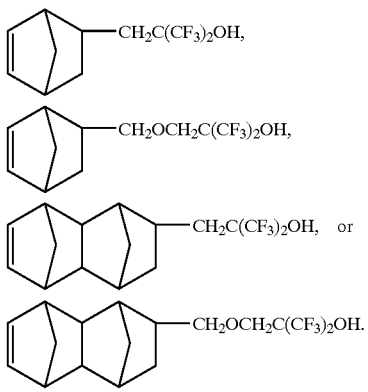

32. A coated substrate for photoimaging to form a semiconductor device comprising a substrate having a coating of a photoresist composition applied to a surface thereof comprising
(a) a polymer having:
(i) a repeat unit derived from at least one ethylenically unsaturated compound containing a fluoroalcohol functional group having the structure:

—$C(R_f)(R_f')OH$ wherein $R_f$ and $R_f'$ are the same or different fluoroalkyl groups of from 1 to about 10 carbon atoms or taken together are $(CF_2)_n$ wherein n is an integer ranging from 2 to about 10; and
(ii) a repeat unit derived from at least one ethylenically unsaturated compound having the structure:

$(H)(R_1)C$=$C(R_2)(CN)$ wherein $R_1$ is a hydrogen atom or CN group, $R_2$ is an alkyl group of 1 to about 8 carbon atoms, hydrogen atom, or $CO_2R_3$ group wherein $R_3$ is an alkyl group of 1 to about 8 carbon atoms or hydrogen atom; and
(b) at least one photoactive component.

33. The coated substrate of claim 1 in which the substrate is a silicon, wafer.

34. The coated substrate of claim 32 wherein the repeat unit derived from the at least one ethylenically unsaturated compound containing the fluoroalcohol functional group is present in the polymer from about 10 to about 60 mole percent and the repeat unit derived from the at least one ethylenically unsaturated compound containing at least one nitrile group is present in the polymer from about 20 to about 80 mole percent.

35. The coated substrate of claim 32 wherein the repeat unit derived from the at least one ethylenically unsaturated compound containing the fluoroalcohol functional group is present in the polymer at less than or equal to about 45 mole percent.

36. The coated substrate of claim 32 wherein the repeat unit derived from the at least one ethylenically unsaturated compound containing the fluoroalcohol functional group is present in the polymer at less than or equal to about 30 mole percent.

37. The coated substrate of claim 32 wherein the photoresist composition is a positive-working photoresist.

38. The coated substrate of claim 32 wherein the polymer further comprises at least one protected functional group.

39. The coated substrate of claim 32 wherein the repeat unit(ii) is derived from as ethylenically unsaturated compound selected from the group consisting of acrylonitrile, methacrylonitrile, trans-1,2-dicyanothylene, and cis-1,2-dicyanothelene.

40. The coated substrate of claim 32 wherein the repeat unit (ii) is derived from acrylonitrile.

41. The coated substrate of claim 38 wherein the functional group of the protected functional group is selected from the group consisting of carboxylic acid and flouroalcohol.

42. The coated substrate of claim 32 wherein at least one fluoroalcohol functional group is protected.

43. The coated substrate of claim 32 in which the polymer further comprises an aliphatic polycyclic group.

44. The coated substrate of claim 43 wherein the percentage of repeat units of the polymer containing aliphatic polycyclic group ranges from about 1 to about 50 mole percent.

45. The coated substrate of claim 32 wherein the photoactive component is a photoacid generator.

46. The coated substrate of claim 32 further comprising at least one member selected from the group consisting of carboxylic acid, a protected fluoroalcohol, and a protected carboxylic acid.

47. The coated substrate of claim 32 further comprising a dissolution inhibitor.

48. The coated substrate of claim 32 wherein the fluoroalcohol functional group has a $pK_a$ of less than or equal to 11.

49. The coated substrate of claim 32 wherein the polymer is a branched polymer.

* * * * *